(12) United States Patent
Behrends et al.

(10) Patent No.: US 8,842,487 B2
(45) Date of Patent: Sep. 23, 2014

(54) POWER MANAGEMENT DOMINO SRAM BIT LINE DISCHARGE CIRCUIT

(71) Applicant: International Business Machines Corporation, Armonk, NY (US)

(72) Inventors: Derick G. Behrends, Rochester, MN (US); Todd A. Christensen, Rochester, MN (US); Travis R. Hebig, Rochester, MN (US); Michael Launsbach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/777,506

(22) Filed: Feb. 26, 2013

(65) Prior Publication Data

US 2014/0092696 A1     Apr. 3, 2014

Related U.S. Application Data

(63) Continuation of application No. 13/630,404, filed on Sep. 28, 2012.

(51) Int. Cl.
G11C 7/00 (2006.01)
G11C 7/12 (2006.01)
G11C 11/413 (2006.01)
G11C 7/18 (2006.01)

(52) U.S. Cl.
CPC .. G11C 7/12 (2013.01); G11C 7/18 (2013.01); G11C 11/413 (2013.01)
USPC ............. 365/203; 365/154; 365/156; 365/63

(58) Field of Classification Search
CPC ........... G11C 7/12; G11C 7/18; G11C 11/413
USPC .................... 365/203, 154, 156, 63
See application file for complete search history.

(56) References Cited

U.S. PATENT DOCUMENTS

| | | | |
|---|---|---|---|
| 4,822,313 A * | 4/1989 | Yasika | 446/69 |
| 5,615,160 A | 3/1997 | Phillips et al. | |
| 5,623,450 A | 4/1997 | Phillips et al. | |
| 5,729,501 A | 3/1998 | Phillips et al. | |
| 6,657,886 B1 | 12/2003 | Adams et al. | |
| 6,901,003 B2 | 5/2005 | Adams et al. | |
| 6,901,017 B2 | 5/2005 | Shimizu | |
| 7,102,944 B1 | 9/2006 | Bunce et al. | |
| 7,102,946 B2 | 9/2006 | Pelella | |
| 7,239,565 B2 * | 7/2007 | Liu | 365/203 |
| 7,280,401 B2 * | 10/2007 | Di Gregorio | 365/185.17 |
| 7,385,865 B2 * | 6/2008 | Khellah et al. | 365/203 |
| 7,414,878 B1 | 8/2008 | Christensen et al. | |
| 7,525,844 B2 * | 4/2009 | Edahiro | 365/185.21 |

(Continued)

*Primary Examiner* — Viet Q Nguyen
(74) *Attorney, Agent, or Firm* — Robert R. Williams

(57) ABSTRACT

A domino static random access memory (SRAM) having one or more SRAM memory cells connected with a local bit line is disclosed. The SRAM may include a global bit line, a first precharge device connected between a voltage supply and the local bit line, and a second precharge device connected between the voltage supply and the global bit line. In addition the SRAM may include a global bit line discharge logic connected with the global bit line and the local bit line. The global bit line discharge logic is adapted to draw the global bit line to a voltage below a precharge voltage and above a ground voltage during a read operation.

1 Claim, 5 Drawing Sheets

(56) References Cited

U.S. PATENT DOCUMENTS

| | | |
|---|---|---|
| 7,535,776 B1 | 5/2009 | Behrends et al. |
| 7,679,949 B1 | 3/2010 | Masleid |
| 7,709,299 B2 | 5/2010 | Matick et al. |
| 7,724,585 B2 | 5/2010 | Behrends et al. |
| 7,760,541 B2 | 7/2010 | Adams et al. |
| 7,782,691 B2 | 8/2010 | Christensen et al. |
| 7,826,251 B2 | 11/2010 | Chang et al. |
| 7,852,693 B2 * | 12/2010 | Christensen et al. ......... 365/203 |
| 8,179,735 B2 * | 5/2012 | Wu ............................... 365/203 |
| 8,184,468 B2 | 5/2012 | Kim et al. |
| 8,254,159 B2 | 8/2012 | Lee et al. |
| 8,279,687 B2 | 10/2012 | Adams et al. |
| 8,335,120 B2 * | 12/2012 | Shinohara ..................... 365/203 |
| 8,422,313 B2 | 4/2013 | Buettner et al. |
| 8,456,923 B2 * | 6/2013 | Geuskens et al. ......... 365/189.02 |
| 8,488,368 B2 | 7/2013 | Christensen et al. |
| 8,587,990 B2 * | 11/2013 | Chan et al. .................... 365/154 |
| 2011/0211401 A1 | 9/2011 | Chan et al. |
| 2011/0305099 A1 * | 12/2011 | Sharma et al. ................. 365/203 |
| 2011/0317478 A1 * | 12/2011 | Chan et al. .................... 365/156 |
| 2012/0155188 A1 | 6/2012 | Buettner et al. |
| 2013/0201753 A1 | 8/2013 | Adams et al. |
| 2013/0258758 A1 * | 10/2013 | Behrends et al. ............. 365/154 |

* cited by examiner

FIG. 1 – Prior Art

POWER MANAGEMENT DOMINO SRAM BIT LINE DISCHARGE CIRCUIT

CROSS-REFERENCE TO RELATED APPLICATIONS

This application is a continuation of U.S. patent application Ser. No. 13/630,404, filed Sep. 28, 2012. The aforementioned related patent application is herein incorporated by reference in its entirety.

TECHNICAL FIELD

The present disclosure relates to a static random-access memory (SRAM). In particular, this disclosure relates to local evaluation logic for a domino-logic SRAM.

BACKGROUND

SRAMs may be arranged in a domino-logic structure in which two or more SRAM cells are connected in parallel to two local bit lines. One of the two local bit lines is coupled to a global bit line through a global bit line discharge logic. Both the local and global bit lines in a domino SRAM are precharged high before a read operation, and may be discharged, or "pulled down" to ground during a read operation. A particular cell is selected for reading by activating the cell's word line. One of the two precharged local bit lines coupled to the selected cell is discharged during a read operation. If the discharged local bit line is the one that is coupled to the global bit line, the discharge of the local bit line activates logic that discharges the global bit line.

FIG. 1 is a schematic representation of a portion of a prior art SRAM circuit 100 having a column of SRAM cells 110, a global bit line (GBL) 106, a local eval logic 122, and a GBL discharge logic 120. Each SRAM cell 110 includes a pair of cross-coupled inverters, 130, 132. SRAM cells are connected to the local eval logic through a local bit line true (LBLT) 102 and a local bit line complement (LBLC) 104. The LBLT and the LBLC are precharged by a local bit line precharge line (LBL_PCH) 114 and transistors 1P1 and 1P2. A write true line (WT) 126 and its associated transistors 1N3 and 1N6, a write complement line (WC) 124 and its associated transistors 1N4 and 1N5, and a write enable line (WE) 118 and its associated transistor 1N7 control the write operations of the cell 110. The GBL 106 is precharged by a GBL precharge line (GBL_PCH) 112 and a transistor 1P3.

A read operation employs the GBL discharge logic 120. As an illustration, to read a "one" from the cell 110 in the SRAM column, a word line (WL) 108 turns on pass transistors 1N1 and 1N2. When the "one" is read, the LBLT 102 remains high while the LBLC 104 is pulled down. The value on the LBLC is inverted to a "one" by an inverter 116, which turns on an N-channel field-effect (NFET) transistor 1N8. Transistor 1N8 pulls down the precharged GBL 106 to ground, effectively placing an inversion of the "one" on the GBL.

SUMMARY

One embodiment is directed to a domino static random access memory (SRAM). The SRAM may include one or more SRAM memory cells connected with a local bit line. The SRAM may also include a global bit line, a first precharge device connected between a voltage supply and the local bit line, and a second precharge device connected between the voltage supply and the global bit line. In addition the SRAM may include a global bit line discharge logic connected between the global bit line and the local bit line. The global bit line discharge logic is adapted to draw the global bit line to a voltage below a precharge voltage and above a ground voltage during a read operation.

Another embodiment is directed to a method for operating a domino static random access memory (SRAM). The method may include precharging a local bit line, the local bit line being connected to an SRAM cell and precharging a global bit line to a precharge voltage. In addition, the method may include reading data from the SRAM. A "zero" data value stored in one of the SRAM cells drives the local bit line to a discharged level. The local bit line discharge level enables the global bit line discharge logic to discharge the global bit line to a voltage level between the precharge voltage level and a voltage above ground.

A further embodiment is directed to a design structure for producing an SRAM. Aspects of the various embodiments may allow circuit size and power consumption in an SRAM to be reduced.

BRIEF DESCRIPTION OF THE DRAWINGS

The drawings included in the present application are incorporated into, and form part of, the specification. They illustrate embodiments of the present invention and, along with the description, serve to explain the principles of the invention. The drawings are only illustrative of embodiments of the invention and do not limit the invention.

DETAILED DESCRIPTION

According to embodiments of the invention, an SRAM global bit line (GBL) may be discharged through GBL discharge logic to a voltage level below a precharge voltage, but above a ground voltage. An SRAM column may contain local evaluation logic and one or more SRAM cells, each cell storing a "one" or a "zero." The SRAM column may be coupled to the global bit line through a global discharge logic. The global discharge logic may include a P-channel field effect transistor (PFET). During an SRAM read operation, a local bit line true (LBLT) or a local bit line compliment (LBLC) may receive a "zero" from an SRAM cell. The LBLT or LBLC may be connected to the input of the global discharge logic. The "zero" on the input to the global discharge logic may cause the GBL to be partially discharged, thus transferring the "zero" to the GBL. The GBL is subsequently precharged to Vdd for a next operation.

Power and space reduction and management are becoming increasingly important as circuit technology advances. Fully discharging GBLs to ground in SRAM circuits requires energy and resources. Decreasing SRAM circuit size and power consumption may enable higher density chips with less overall power consumption. Utilizing a single PFET device to discharge a GBL may eliminate a need for an inverter to drive an NFET device within the GBL discharge logic. By reducing the number of transistors in the GBL discharge logic, the circuit area required to discharge the global bit lines may be reduced. A reduction in circuit area may result in shorter GBLs, resulting in less energy consumption to charge and discharge them. Additionally, the PFET device electrical characteristics only allow the GBL to be discharged to a voltage level of one PFET threshold voltage (Vt) above ground, according to embodiments of the invention.

As may be seen from the following equation, the reduction of overall GBL voltage swing may reduce the energy consumed to charge and discharge the GBL:

$$P = A * C * V^2 * F$$

Where:
P=chip dynamic power consumption (W)
A=activity factor (coefficient with values between 0 and 1 indicating signal activity level)
C=capacitance of nodes being charged and discharged (F)
V=signal voltage swing (V)
F=switching frequency (Hz)

Reducing the difference in voltage between the precharge voltage and the discharge voltage reduces V in the equation, which in turn may exponentially reduce power used in a read operation. Reduction of read operation power may provide opportunities for SRAM and overall chip power management.

Figure 1:
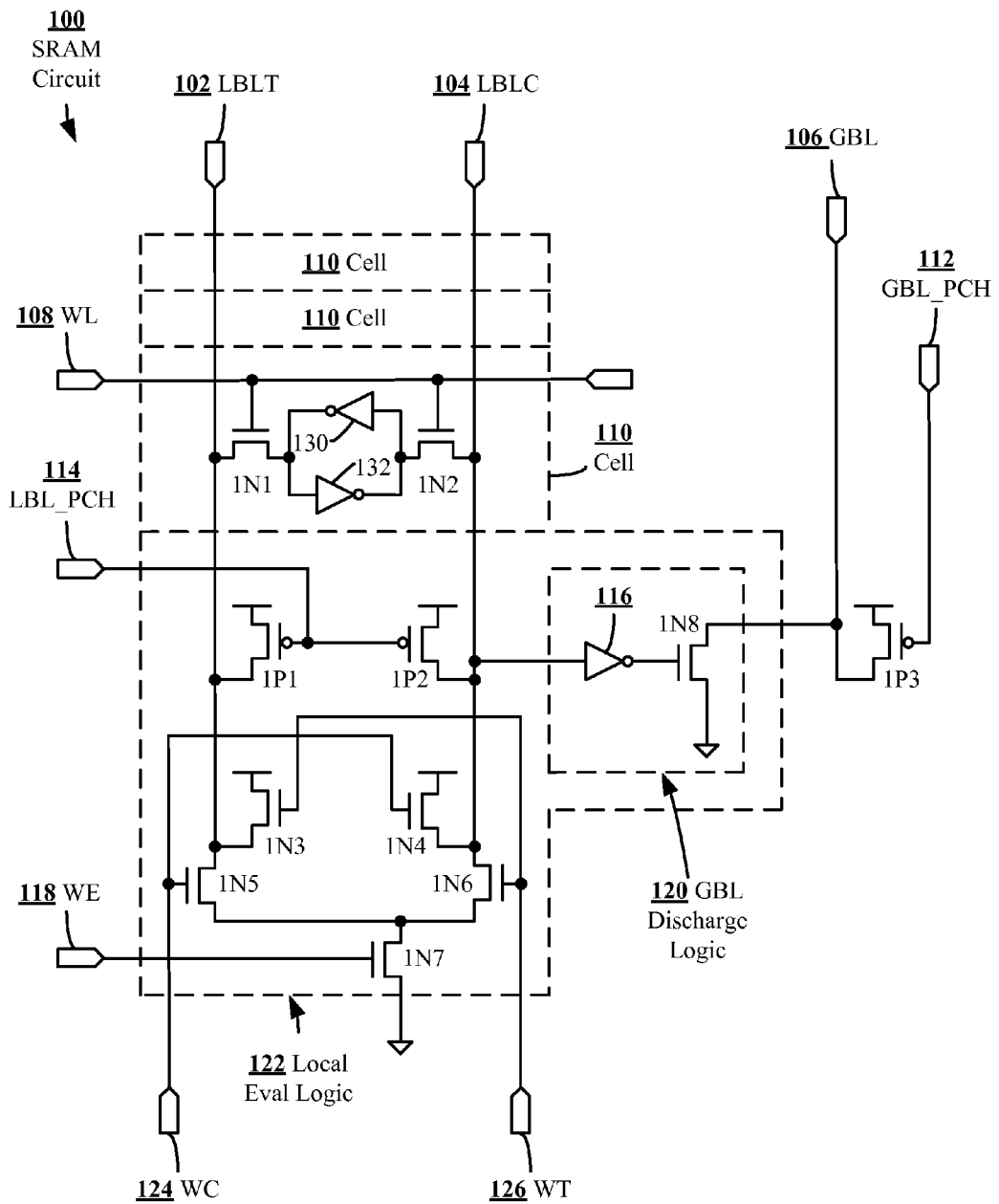
FIG. 1 is a schematic representation of a portion of a prior art SRAM circuit having global bit line discharge logic.
Figure 2:
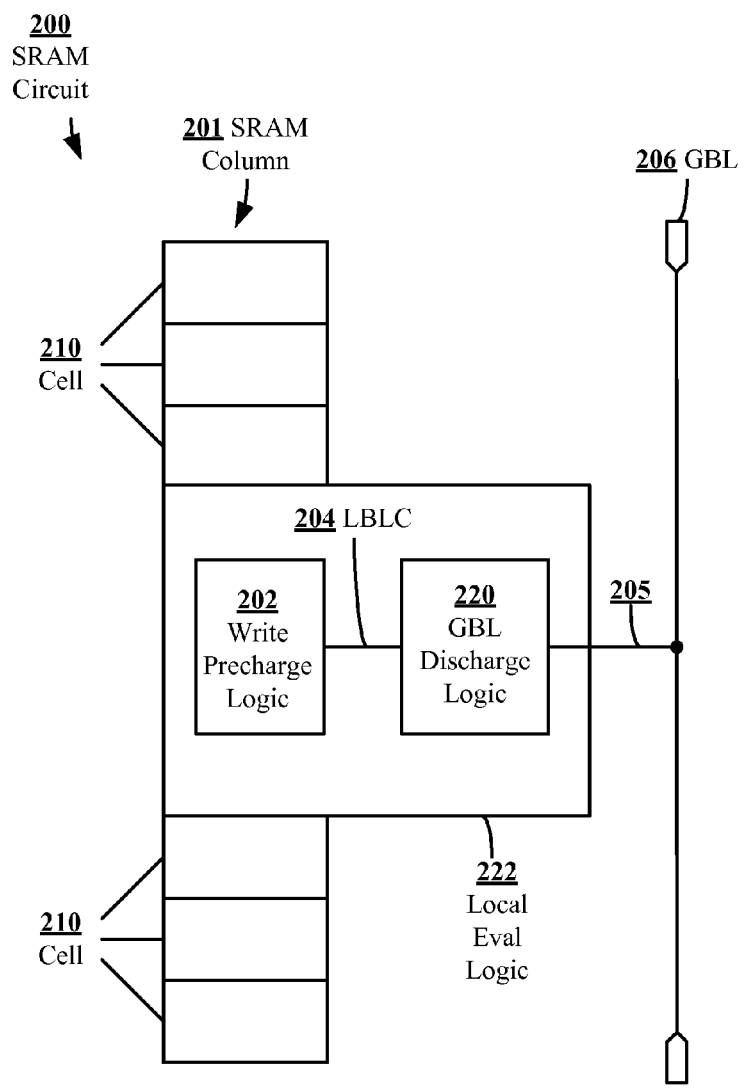
FIG. 2 is a diagrammatic representation of a portion of an SRAM including a column of SRAM cells, and global bit line discharge logic and a global bit line according to embodiments of the invention.

FIG. 2 is a diagrammatic representation of a portion of an SRAM circuit having a local bit line compliment (LBLC) line 204 coupled to a write precharge logic 202 and a GBL discharge logic 220, according to embodiments of the invention. The terms "true" and "complement" are used only to distinguish two similar but inversely operable lines.

An SRAM circuit 200 may contain a column 201 coupled to a global bit line 206. The column may have a plurality of groups of SRAM cells 210 and a local evaluation logic 222 for each group. A global bit line discharge line 205 may couple the local evaluation logic to the global bit line. If a "zero" is read from a cell, the LBLC 204 communicates with the GBL discharge logic 220 to partially discharge the GBL.

In embodiments of the invention, partial GBL discharge may be carried out through the GBL discharge logic 220 which may use a switch, such as a P-channel field effect transistor (PFET), operated by the LBLC or the LBLT line. So long as there is no discharge path for the global bit line, the global bit line may not be pulled down. Once the LBLC or LBLT line enables a discharge path for the global bit line, the global bit line may be partially discharged by the column's GBL discharge logic. The GBL discharge logic may have a gate operated by a local bit line.

Figure 3:
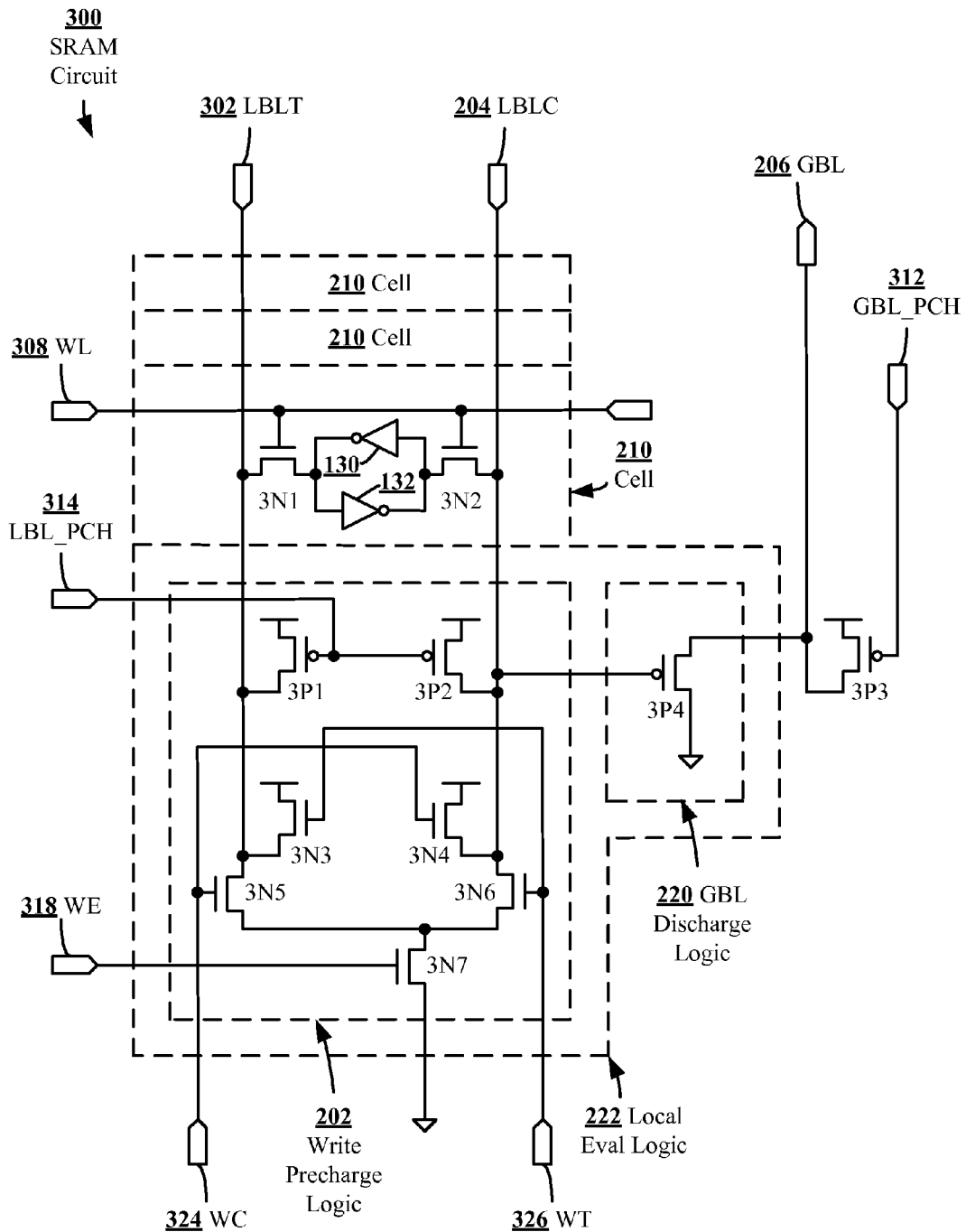
FIG. 3 is a schematic representation of a portion of an SRAM circuit having a global bit line discharge logic PFET to discharge a global bit line, according to an embodiment of the invention.

FIG. 3 is a schematic representation of a portion of an SRAM circuit 300 having the GBL discharge logic 220 that may discharge the global bit line 206, according to an embodiment of the invention. The LBLC 204 may contain a compliment value of read data in a read operation. The compliment value enables the GBL discharge logic 220 to discharge the shared global bit line 206. A local bit line true (LBLT) 302 and the local bit line complement (LBLC) 204 are precharged prior to read and write operations by a local bit line precharge line 314 and transistors 3P1 and 3P2. The global bit line 206 is precharged prior to read operations by a global bit line precharge line 312 and a transistor 3P3.

A write enable line 318 and its associated transistor 3N7 controls whether a read or write operation of the cell 210 is performed. A write operation employs a write true line 326 and its associated transistors 3N3 and 3N6, and a write complement line 324 and its associated transistors 3N4 and 3N5 for inputting data to the cell 210.

A read operation employs the LBLC 204 and the GBL discharge logic 220. In one embodiment, the GBL discharge logic 220 may include a PFET transistor 3P4. The gate of PFET 3P4 may be coupled to the LBLC 204. The source of PFET 3P4 may be coupled to the GBL 206. The drain of PFET 3P4 may be coupled to the ground.

As an illustration, to read a "one" from the cell 210, a word line 308 turns on pass transistors 3N1 and 3N2. A local bit line true 302 remains high, as a one is stored on the left node of the cell, while the local bit line complement (LBLC) 204 is pulled down. The LBLC is coupled to a global bit line discharge transistor 3P4. The low on the LBLC turns on the global bit line discharge transistor 3P4. When turned on, PFET transistor 3P4 provides a discharge path for the precharged GBL 206 to be pulled down, outputting the compliment of the "one" stored in the cell 210 on the GBL. GBL is discharged to a voltage level above ground. A stored "zero" may be read in a similar operation as described above.

Figure 4:
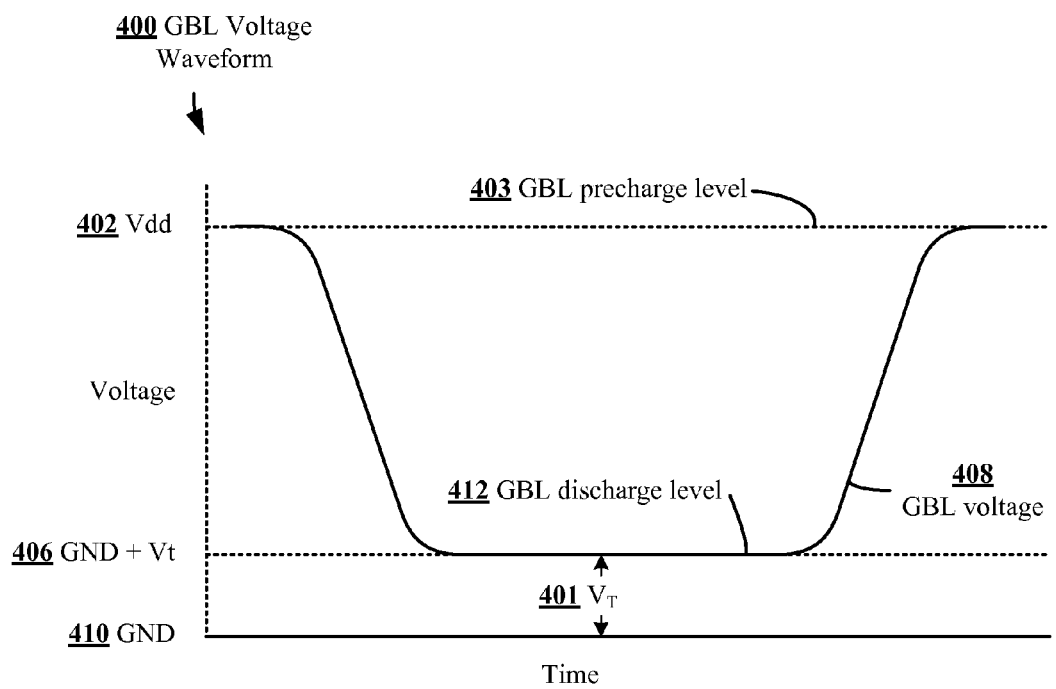
FIG. 4 is a waveform diagram of a discharge operation of an SRAM global bit line, according to embodiments of the invention.

FIG. 4 is waveform diagram of the global bit line (GBL) 206 voltage level during a read operation of an SRAM cell according to embodiments of the invention. FIG. 4 is an exemplary depiction that illustrates a typical GBL voltage 408 swing between the GBL precharge level 403 and the GBL discharge level 412. In this example, the GBL precharge level is identical to supply voltage (Vdd) 402. Other embodiments may employ GBL precharge levels that differ from supply voltage (Vdd).

Prior to a read operation, the GBL 206 is precharged to Vdd. When a "one" is read from a cell, the GBL discharge logic (220) discharges the GBL 206 to a GBL discharge level 412. The GBL discharge level is one PFET threshold voltage 401 above GND 410.

In an exemplary embodiment of the invention, the PFET thresholds Vt 401 may be approximately ten percent of the supply voltage Vdd 402. In another exemplary embodiment of the invention, the PFET threshold Vt may be approximately twenty percent of the supply voltage Vdd. A generally accepted range of Vt values lies between approximately ten and thirty percent of supply voltage Vdd, but this range does not limit possible Vt values in any way. PFET threshold voltages may vary according to several factors, not limited to various design parameters and semiconductor process variations. One skilled in the art of SRAM design will understand how various design parameters can be determined to effect a change in PFET threshold voltages (Vt).

Figure 5:
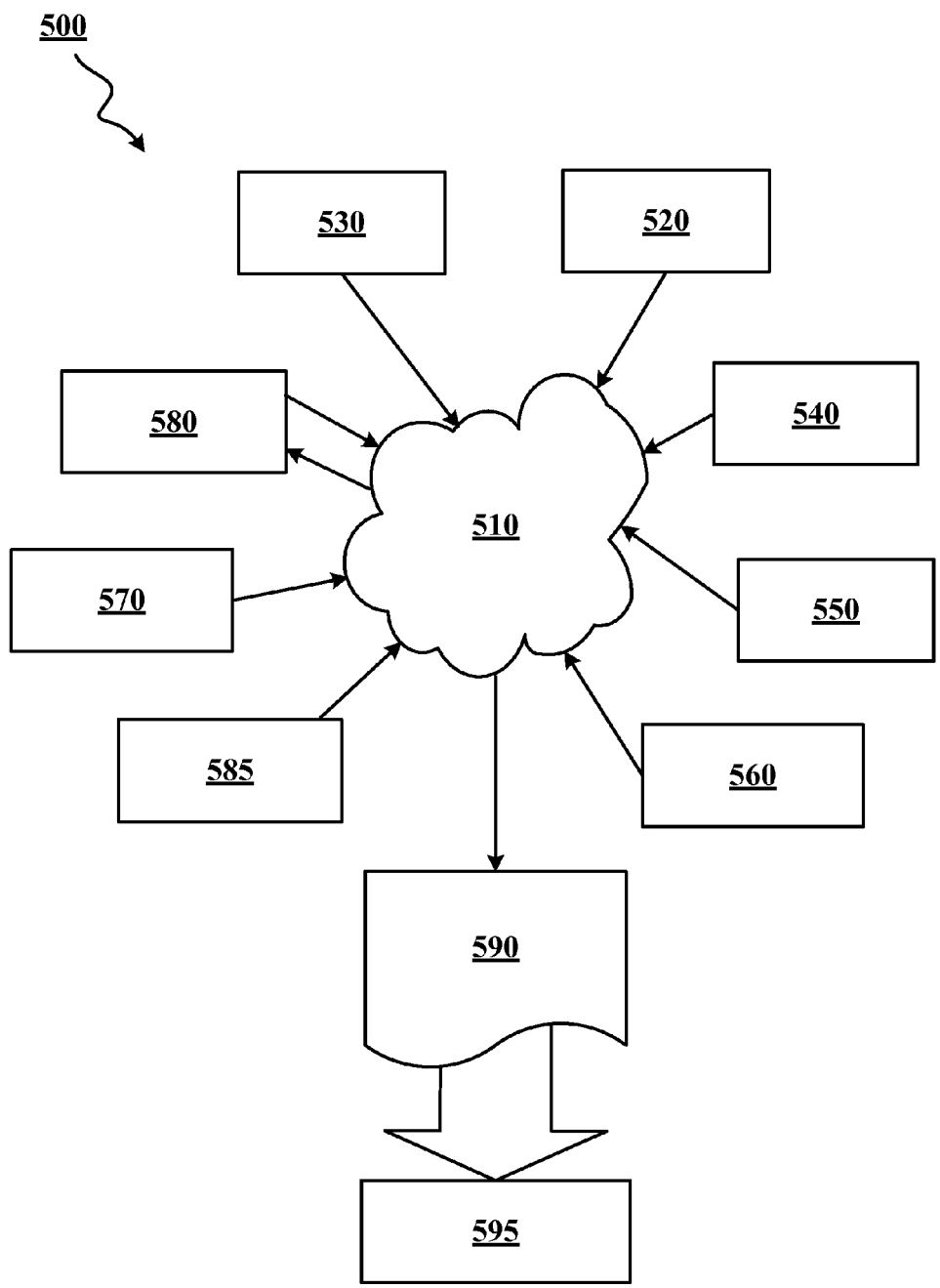
FIG. 5 is a flow diagram of a design process used in semiconductor design, manufacture, and/or test of the inventive SRAM depicted in FIGS. 2, 3 and 4, according to embodiments of the invention.

FIG. 5 illustrates multiple design structures 500 including an input design structure 520 that is preferably processed by a design process. Design structure 520 may be a logical simulation design structure generated and processed by design process 510 to produce a logically equivalent functional representation of a hardware device. Design structure 520 may alternatively include data or program instructions that, when processed by design process 510, generate a functional representation of the physical structure of a hardware device. Whether representing functional or structural design features, design structure 520 may be generated using electronic computer-aided design, such as that implemented by a core developer/designer. When encoded on a machine-readable data transmission, gate array, or storage medium, design structure 520 may be accessed and processed by one or more hardware or software modules within design process 510 to simulate or otherwise functionally represent an electronic component, circuit, electronic or logic module, apparatus, device, or system such as those shown in FIGS. 2 and 3. As such, design structure 520 may include files or other data structures including human or machine-readable source code, complied structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 510 preferably employs and incorporates hardware or software modules for synthesizing, translating, or otherwise processing a design/simulation functional equivalent of the components, circuits, devices, or logic structures shown in FIGS. 2 and 3 to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describe the connections to other elements and circuits in an integrated circuit design. Netlist 580 may be synthesized using an iterative process in which Netlist 580 is resynthesized one or more times depending on design specifications and parameters for the device. As with other design structure types described herein, Netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 550, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510, without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures, along with any additional mechanical design or data, to generate a second design structure 590. Design structure 590 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 2 and 3. In one embodiment, design structure 590 may comprise a compiled, executable HDL simulation model that functionally simulates the devices shown in FIGS. 2 and 3.

Design structure 590 may also employ a data format used for the exchange of layout data of integrated circuits and/or symbolic data format (e.g., information stored in a GDSII, GL1, OASIS, map files, or any other suitable format for storing such design data structures). Design structure 590 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2 and 3. Design structure 590 may then proceed to a state 595 where, for example, design structure 590 proceeds to tape-out, is released to manufacturing, is released to a mask house, is sent to another design house, is sent back to the customer, etc.

Although the present invention has been described in terms of specific embodiments, it is anticipated that alterations and modifications thereof will become apparent to those skilled in the art. Therefore, it is intended that the following claims be interpreted as covering all such alterations and modifications as fall within the true spirit and scope of the invention.

What is claimed is:

1. A method for operating a domino static random access memory (SRAM) comprising:
    precharging a local bit line, the local bit line being connected to an SRAM cell;
    precharging a global bit line to a precharge voltage; and
    reading data from the SRAM, the reading further comprising:
    a "zero" data value stored in the SRAM cell driving the local bit line to a discharged level, the local bit line discharged level enabling a global bit line discharge logic to discharge the global bit line to a voltage level between the precharge voltage level and a voltage above ground, and wherein the global bit line discharge logic is a P-Channel Field-effect transistor (PFET) transistor having a drain connected to a ground, a source connected to the global bit line, and a gate connected to the local bit line, and the PFET transistor drawing the global bit line to one PFET threshold above ground.

* * * * *